United States Patent
Landis et al.

(10) Patent No.: US 8,864,489 B2
(45) Date of Patent: *Oct. 21, 2014

(54) THERMAL NANOIMPRINT LITHOGRAPHY MOULD, PROCESS FOR PRODUCING IT, AND THERMAL NANOIMPRINT PROCESS EMPLOYING IT

(75) Inventors: Stefan Landis, Voiron (FR); Sergio Nicoletti, Sinard (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 497 days.

This patent is subject to a terminal disclaimer.

(21) Appl. No.: 12/880,632

(22) Filed: Sep. 13, 2010

(65) Prior Publication Data

US 2011/0062634 A1   Mar. 17, 2011

(30) Foreign Application Priority Data

Sep. 17, 2009  (FR) ..................................... 09 56390

(51) Int. Cl.
*B29C 35/02* (2006.01)
*G03F 7/00* (2006.01)
*B82Y 10/00* (2011.01)
*B82Y 40/00* (2011.01)

(52) U.S. Cl.
CPC .............. *G03F 7/0002* (2013.01); *B82Y 10/00* (2013.01); *B82Y 40/00* (2013.01)
USPC ............................ 425/385; 425/394; 264/404

(58) Field of Classification Search
USPC ................... 425/385, 394; 264/404
See application file for complete search history.

(56) References Cited

U.S. PATENT DOCUMENTS

| 6,949,199 B1* | 9/2005 | Gauzner et al. ................... 216/2 |
| 7,927,089 B2 | 4/2011 | Seki et al. |
| 2005/0208171 A1* | 9/2005 | Seki et al. ..................... 425/406 |
| 2006/0279022 A1 | 12/2006 | Seki et al. |
| 2007/0014920 A1 | 1/2007 | Syms |
| 2009/0026658 A1* | 1/2009 | Hosoda et al. ................ 264/319 |
| 2010/0065986 A1* | 3/2010 | Nakamura et al. ............ 264/310 |
| 2010/0072665 A1 | 3/2010 | Imai et al. |
| 2012/0112387 A1 | 5/2012 | Landis et al. |

FOREIGN PATENT DOCUMENTS

| EP | 1 726 991 A2 | 11/2006 |
| WO | WO 2004/058479 A1 | 7/2004 |
| WO | WO 2004/114017 | 12/2004 |

OTHER PUBLICATIONS

European Search Report dated Nov. 30, 2011, for European Patent Application No. 11 17 9917.
French Search Report dated Mar. 24, 2011, for French Patent Application No. 1057112.

* cited by examiner

*Primary Examiner* — James Sanders
(74) *Attorney, Agent, or Firm* — Miles & Stockbridge P.C.

(57) ABSTRACT

A heating mould for thermal nanoimprint lithography, a process of producing the heating mould, and a process for producing a nanostructured substrate which include the heating mould. The heating mould includes the heating mould. The heating mould includes a substrate having a first principal surface and a second principal surface, and a through-cavity extending from a first orifice in the first principal surface up to a second orifice in the second principal surface. The mould also includes a heating layer, an electrically and thermally insulating layer which covers the heating layer and, at least partially, imprint patterns, and leads for supplying an electric current to the heating layer.

37 Claims, 8 Drawing Sheets

THERMAL NANOIMPRINT LITHOGRAPHY MOULD, PROCESS FOR PRODUCING IT, AND THERMAL NANOIMPRINT PROCESS EMPLOYING IT

TECHNICAL FIELD

The invention relates to a thermal or thermally-assisted nanoimprint lithography mould.

The invention furthermore relates to a process for preparing this mould.

The invention finally relates to a thermal nanoimprint lithography process that employs this mould.

PRIOR ART

The technical field of the invention may be generally defined as that of nanoimprint lithography or NIL.

Nanoimprint lithography combines the small critical dimensions of electron beam lithography with the high yield of optical technologies (scanner or stepper technology), and is therefore a technique that may be profitably applied to high-definition lithography.

There are many types of nanoimprint lithography but the most common are thermal nanoimprint lithography and UV-assisted nanoimprint lithography.

Thermal nanoimprint lithography is the oldest of these techniques and was developed by Professor Stephen Chou and his team in 1995.

The thermal or thermally-assisted nanoimprint lithography technique is described in FIGS. 1A to 1F.

It employs, on the one hand, a rigid mould (1)—generally made of silicon or a silicon containing compound ($SiO_2$, silicon nitride, etc.), a polymer, or nickel—that contains structures, patterns, in relief for duplication (2), and, on the other hand, a layer of material (3) such as a thermoplastic polymer or an organic resin deposited on the substrate (4) to be patterned. The mould is produced by conventional lithography or etching techniques.

The layer of material (3) is heated to a temperature above the glass transition temperature or the melting point of the material, by means of heating elements (5) (FIG. 1B).

Next, pressure is applied to the back side of the mould so as to press the latter into the heated layer of material (3) (FIG. 1C).

After this hot pressing, the temperature of the material is lowered to below the glass transition temperature or the melting point of the material, for example by deactivating the heating elements (5), to set the structures imprinted into the layer of material (FIG. 1D).

Next the mould is released, that is to say that the mould (1) is separated from the substrate supporting a layer of material imprinted with the imprinted patterns (6) (FIG. 1E).

Finally, the residual thickness (7) that remains under the imprinted patterns (6) is opened up (FIG. 1F).

After the thermal nanoimprint process, the mould patterns are reproduced in the layer of material, such as a polymer, and may serve as an etch mask.

In this way, patterns ranging from a few nanometers to several microns may be produced in the material, such as a polymer, and subsequently transferred on the substrate.

After more than ten years of development, this lithography technique is already being used in some sectors of industry.

In UV-assisted nanoimprint lithography, also known as flash imprint lithography or photo-nanoimprint lithography, a transparent mould, for example made of quartz, is pressed into a monomer or prepolymer solution at room temperature, by applying slight pressure. Next, the patterns are set by photopolymerization of the monomers, or crosslinking or curing, with UV radiation. This technique is currently undergoing significant development because of the possibility of alignment between the various levels with the transparent mould.

In all nanoimprint techniques, the fabrication of the mould is a critical step since the resolution and the production yield obtained by nanoimprinting and nanomoulding are largely dependent on the quality of the mould used.

In the thermal nanoimprint technique, the mould is fabricated from a bulk, solid, silicon substrate on which patterns are fabricated using standard lithography (optical, electron beam or X-ray lithography) and etching technologies. The thickness of these moulds generally lies within a range that extends from a few hundred microns to a few millimeters for several reasons, namely:

on the one hand, to allow their manipulation and their positioning on the substrates; and on the other hand, because the quality of the surface of the mould, produced with standard-thickness substrates, with conventional microfabrication and nanofabrication techniques, is thus guaranteed and comparable to that of the substrates on which the imprint will be produced.

As may be seen from the thermal nanoimprint process flow chart illustrated in FIG. 1, a step of heating up said mould, as well as the imprint material and the substrate that supports it, is necessary (FIG. 1B).

Typically, the temperatures involved lie between 60° C. and 250° C. They advantageously correspond to the glass transition temperature ($T_g$) or melting point ($T_m$) of the imprint material.

To ensure mechanical stability sufficient to release the mould, that is to say to ensure the separation of the mould from the imprint material (material to be printed), it is then necessary to cool the assembly below $T_g$ or $T_m$. The time required to complete this temperature cycle may be as long as several minutes, even tens of minutes. Bearing in mind the duration of the other operations associated with the implementation of this process, namely the coating with the material such as a resin, the contacting, the pressing and the releasing of the mould, the duration of this temperature cycle consequently limits the yield of this type of technology.

Furthermore, with the silicon moulds that are generally employed in the thermal nanoimprint technique, the alignment between patterns on the mould and patterns that have already been produced on the wafer to be imprinted is possible, but very difficult.

This is because, since the silicon mould is not transparent at visible wavelengths, the alignment requires the use of what is called a dual-objective camera.

Moreover, this alignment cannot be performed when the mould and the plate, wafer, for pressing are very close to each other, because it is necessary to be able to position the camera. The alignment is therefore necessarily performed when the gap between the mould and the plate, wafer, for pressing is larger than a few centimeters. This constraint thus limits the alignment capability.

Typically, it may be hoped to obtain an alignment precision within a range of several hundred nanometers, yet this is completely inadequate for many applications. Consequently, the use of silicon moulds limits the field of application of thermal nanoimprint technology.

Moulds fabricated from a quartz substrate do enable imprint structures (structures to be printed) to be aligned with existing structures on the surface of the wafer, plate, before cross-linking, or curing the polymer by exposure to UV. However, the fabrication of the mould still remains a problem because, on the one hand, quartz substrates are more expensive and more difficult to pattern and, on the other hand, the fabrication process control is not as advanced as for substrates such as silicon, slices wafers.

There thus exists, with regard to the above, a need for thermally-assisted nanoimprint lithography moulds, or more simply for thermal nanoimprint moulds, which require little energy to reach the working temperature, which have a low thermal inertia and which enable heating cycles, increase in temperature, cooling, decrease in temperature, the duration of which is as short as possible and, in any case, much shorter than the duration of the thermal cycles achievable with existing thermal nanoimprint moulds.

Furthermore, there is a need for thermal nanoimprint moulds that are easy to fabricate, easy to manipulate, of small volume and that have an excellent surface quality and an excellent resolution.

Finally, there is a need for thermal nanoimprint moulds that can be aligned and positioned easily with high precision, for example in the range from 10 nm to 50 nm, like quartz moulds, but without the drawbacks of the latter and without recourse to complex devices such as dual-objective cameras.

SUMMARY OF THE INVENTION

The goal of the present invention is to provide a mould for thermal nanoimprint lithography which meets, among others, the needs listed above.

The goal of the present invention is also to provide a mould for thermal nanoimprint lithography that does not have the drawbacks, faults, limitations and disadvantages of the moulds of the prior art and which solves the problems of the moulds of the prior art.

This goal, and also others, are achieved, according to the invention, by a heating mould for thermal nanoimprint lithography comprising:

- a substrate (21) having a first principal surface (22) and a second principal surface (23) and a through-cavity (24) extending from a first orifice (27) in the first principal surface (22) up to a second orifice (28) in the second principal surface (23), said first principal surface (22) being, optionally, at least partially covered by a first membrane (29) closing off completely or partially said first orifice (27), or even leaving said first orifice (27) free, and said second orifice (28) being completely closed off by a second electrically and thermally insulating membrane (30) resting with a first of its sides (31) on said second principal surface (23) and at least partially covering said second surface (23);
- optionally, a thermally conducting layer (33) that mechanically supports the second membrane (30) on said first side (31) of the second membrane (30) above (32) said second orifice (28);
- optionally, an insulating layer beneath said thermally conducting mechanical support layer (33);
- heating means (34) on the other (35) of the sides of said second membrane (30) in a zone of said second membrane (30) above (32) said second orifice (28);
- an electrically and thermally insulating layer (36) which covers said heating means (34) and, at least partially, said second membrane (30);
- imprint patterns (patterns to be printed) (37) on said electrically and thermally insulating layer (36) in a zone of said electrically and thermally insulating layer (36) above said second orifice (28); and
- means (38) for supplying an electric current to said heating means (34).

The mould according to the invention has a novel structure, never before described or suggested by the prior art.

The mould according to the invention has, as its main feature, a heating element, heating means integrated onto the membrane that may be termed a "suspended membrane", intended to support structures or patterns which will, later on, be imprinted into a layer of material, such as a thermoplastic polymer or resin.

These structures or patterns are of a size that can vary from a few nanometers to several microns.

The mould according to the invention meets, among others, the needs listed above for thermal nanoimprint lithography moulds, meets all the requirements and criteria of this type of mould, does not have the drawbacks, faults, limitations and disadvantages of the moulds of the prior art and provides a solution to the problems posed by the moulds of the prior art.

The mould according to the invention, particularly because it has a small volume and because its total volume is reduced and limited to the assembly comprising the membrane, the heating element and the nanostructures or microstructures, requires a reduced amount of energy to reach the working temperature. The heating and cooling time is also significantly reduced, which greatly increases the speed of the process, its capacity and its yield, and greatly reduces its cost.

Typically, the duration of a cycle of heating (to reach a temperature that lies between, for example, 100° C. and 200° C.) and cooling (returning, for example, to 30° C.) is reduced from a few minutes, even a few tens of minutes, to a few seconds.

Advantageously, said first (22) and second (23) principal surfaces may be planar and parallel.

Advantageously, said first (22) and second (23) principal surfaces may be horizontal and the first principal surface may be then defined as a bottom surface and the second principal (23) surface may be then defined as a top surface.

Advantageously, the mould according to the invention may furthermore comprise alignment marks (39,40).

Advantageously, said alignment marks (39,40) are located in the second membrane (30) and/or in said electrically and thermally insulating layer and/or on said electrically and thermally insulating layer (36) near the imprint patterns (37).

These alignment or positioning marks (39) enable fine alignment or positioning of the imprint patterns (37), supported by the mould, relative to a reference level and to patterns already produced on the sample to be imprinted.

Fine alignment, namely with a misalignment, gap, smaller than 100 nm, is thus made possible, something which was, until now, not achievable with the bulk, solid, silicon moulds currently used in thermal nanoimprint technology.

Advantageously, the substrate may be made of a material chosen from materials compatible with microfabrication and nanofabrication processes and technologies, such as silicon, silicon oxide, silicon nitride, germanium, sapphire, GaAs and, generally, any material compatible with technologies dedicated to microelectronics and to microtechnologies (MEMS for example), and composite materials comprising several of these materials.

Advantageously, the first and second membranes (29, 30) may be made of a material chosen from materials resistant to the anisotropic etching of the substrate material, such as $Si_3N_4$ if the substrate is made of Si.

Advantageously, the heating means (34) may be made of a material chosen from platinum, titanium nitride, single-crystal silicon, polycrystalline silicon and, generally, and all the conductive material compatible with technologies dedicated to microelectronics and to microtechnologies, in other words, microfabrication and nanofabrication technologies.

Advantageously, the electrically and thermally insulating layer (36) is made of a material chosen from $SiO_2$, $Si_3N_4$, $Al_2O_3$, $HfO_2$ and all the electrically and thermally insulating material, insulator, compatible with microfabrication and nanofabrication technologies.

Advantageously, the imprint patterns (37) are made of a material chosen from Si, $SiO_2$, $Si_3N_4$, $Al_2O_3$, $HfO_2$ and all materials compatible with microfabrication and nanofabrication technologies.

The invention furthermore relates to a process for fabricating a mould, such as that described above, in which the following steps are performed in succession:

a) a substrate (21) having a first principal (22) surface and a second principal surface (23) is provided;

b) optionally, a thermally conducting and mechanical support layer (33) is formed in a zone of the second principal surface (23) of the substrate;

c) optionally, a first membrane (29) is deposited on said principal surface (22);

d) a second electrically and thermally insulating membrane (30) is deposited on said second principal surface (23);

e) an electrically resistive heating layer is deposited on a zone of the second membrane (30) above the thermally conducting and mechanical support layer (33);

f) the electrically resistive heating layer is shaped;

g) an electrically and thermally insulating layer (36) is deposited on said shaped, electrically resistive heating layer (34) and onto the second membrane;

h) imprint patterns (37) are produced on said electrically and thermally insulating layer (36);

i) at least one lead (38) for supplying electric current to the electrically resistive heating layer is made; and j) optionally, the first membrane is etched, then a cavity is formed in the substrate from a first orifice in the first principal surface up to the thermally conducting mechanical support layer (33), in a zone of the second principal surface; and, optionally, alignment or positioning marks are produced in the membrane layer (30) and/or in the insulating layer (36) and/or on said electrically and thermally insulating layer (36) near the imprint patterns (37).

Advantageously, the current lead (or leads) is (or are) fabricated by etching at least one via through the first membrane, optionally through the second membrane, and through the substrate, and by filling this via by electrodeposition.

Finally, the invention relates to a process for producing a substrate comprising a nanostructured surface by thermal nanoimprint lithography, in which the mould, such as described above, is employed.

Such a process differs fundamentally from the process of the prior art because it specifically employs a mould according to the invention and has all the advantages inherently linked with this mould, most of which have been mentioned above.

The invention will be better understood on reading the following detailed description given, by way of non-limiting example, with reference to the appended drawings in which:

DETAILED DESCRIPTION OF PARTICULAR EMBODIMENTS

It should first of all be explained that within the scope of the present description terms such as "on" and "above" used to define the position of a first element of the mould relative to a second element do not mean that the first element is at a greater height than the second element in a vertical plane, but rather aim simply to describe the relative position of the first element with respect to the second element without these two elements necessarily being located in a vertical plane. The same applies to the terms "below" and "beneath" and to the terms "top" and "bottom".

Figure 1A:
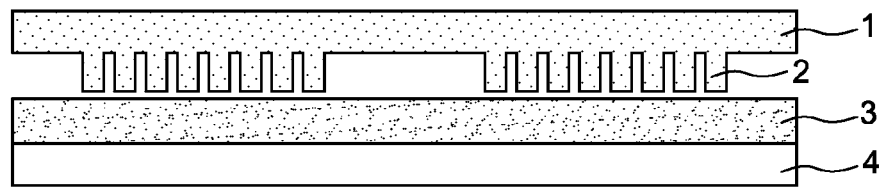
FIGS. 1A to 1F show schematic vertical cross sections views that show, in succession, the steps for fabricating a nanostructured substrate by a thermal nanoimprint process.
Figure 1B:
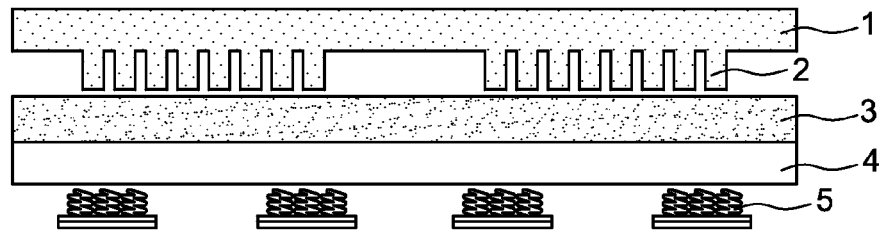
Figure 1C:
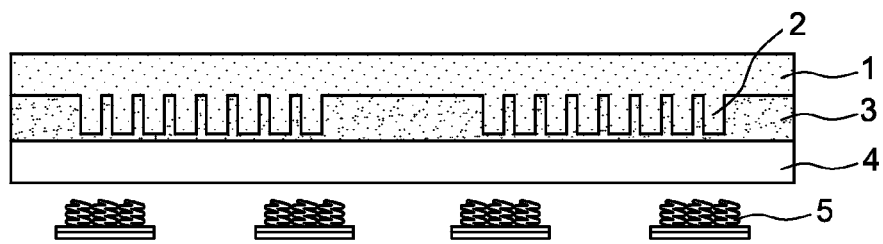
Figure 1D:
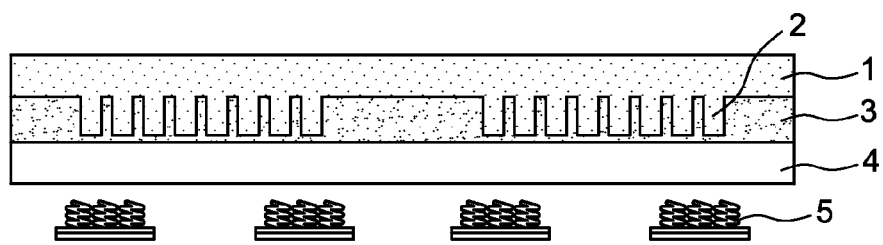
Figure 1E:
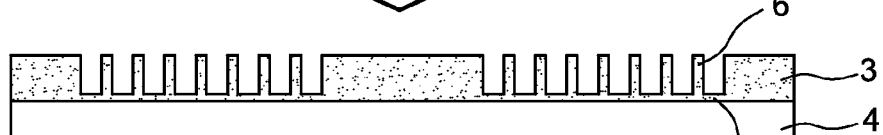
Figure 1F:
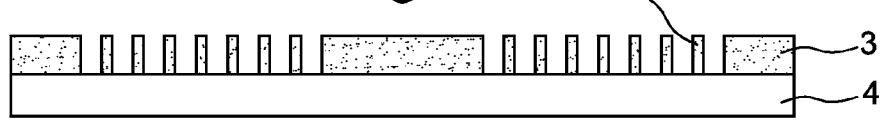
Figure 2A:
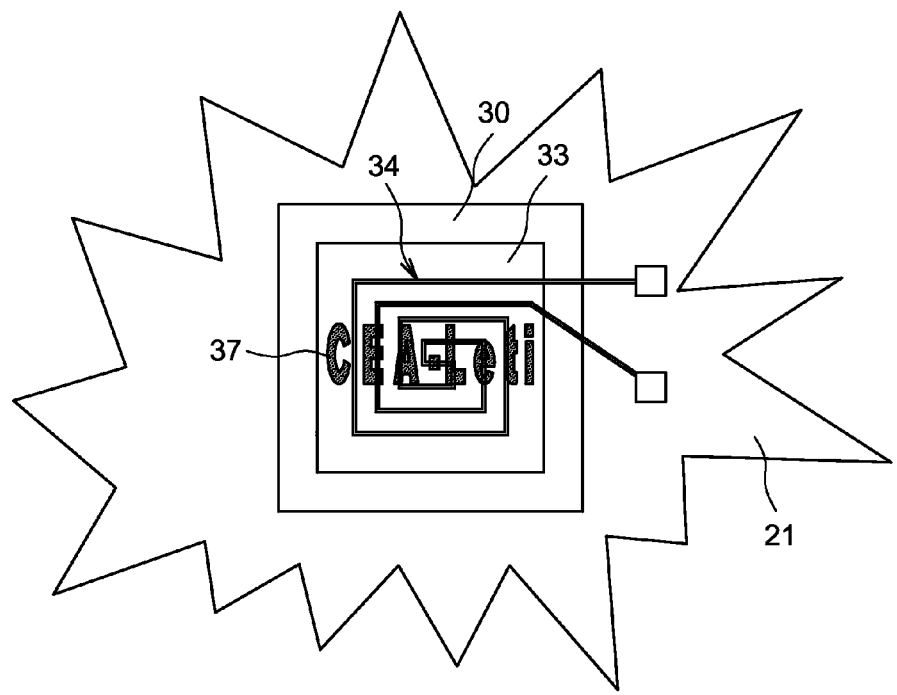
FIG. 2A is a schematic top view of a heating mould according to the invention.
Figure 2B:
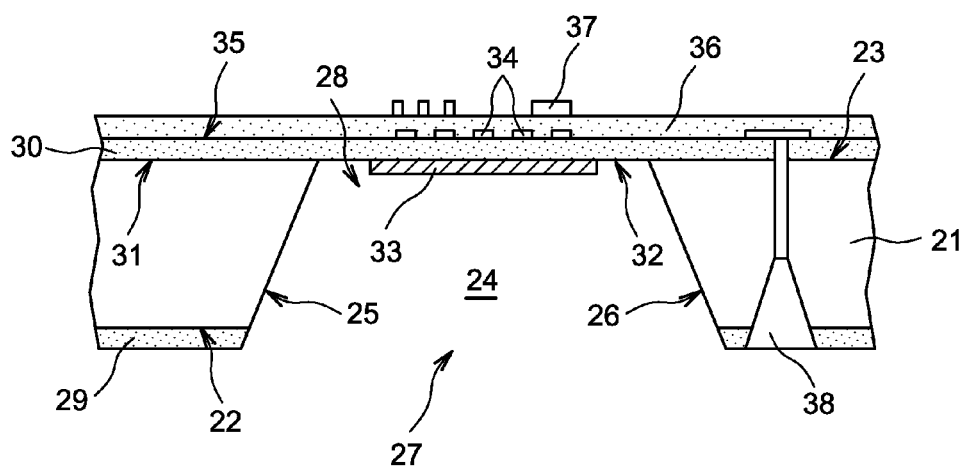
FIG. 2B is a schematic view, in a vertical cross section, of a heating mould according to the invention.

A mould according to the invention is shown in FIGS. 2A and 2B.

It comprises a substrate (21) comprising a first principal surface (22) and a second principal surface (23).

In FIG. 2B, the first (22) and second (23) principal surfaces are planar, parallel and horizontal.

The first principal surface (22) may therefore be defined as a bottom surface, whereas the second principal surface may be defined as a top surface. Of course, this arrangement of the first principal surface (22) and of the second principal surface (23) is given merely by way of example and other arrangements of these two surfaces could also be envisaged.

The substrate (21) may thus take the form of a plate or wafer comprising two planar, parallel surfaces (22, 23) that are for example square, rectangular or even circular.

The thickness of the substrate (21), that is to say the distance between the first principal surface (22) of the substrate (21) and the second principal surface (23) of the substrate (21), typically lies between 350 µm and 735 µm, depending on the thickness of the substrate chosen.

The substrate (21) may be made of any material compatible with microfabrication and nanofabrication processes, such as silicon, silicon oxide, silicon nitride, germanium, sapphire, GaAs and composites comprising several of these materials.

A preferred material is silicon.

A through-cavity (24) defined by sidewalls (25, 26) extends into the substrate (21) from a first orifice (27) in the first principal surface (22) up to a second orifice (28) in the second principal surface (23).

This cavity (24), and therefore the two orifices, are generally of circular or rectangular section, depending on the fabrication processes chosen, and the second orifice (28) is generally smaller than or of equal size to the first orifice (27). For example, the second orifice (28) generally has a diameter smaller than the diameter of the first orifice, especially if the etch is an anisotropic wet etch.

As shown in FIG. 2B, the cavity (24) may thus form a truncated cone, the sidewalls (25, 26) of which converge from the first principal surface (22) up to the second principal surface (23).

However, the fact that the cavity (24) has oblique sidewalls (25, 26) is of no particular interest and other configurations for the sidewalls (25, 26) of the cavity (24) could also be envisaged.

The first principal surface (22) is optionally covered by a first membrane (29) (in the figures, shown as a bottom membrane).

This first membrane (29), when present, may cover all or part of the first principal surface (22) of the substrate and may either leave the first orifice (27) completely free or completely or partially close off said first orifice.

In the figures, by way of example, an embodiment is shown in which the first membrane (29) leaves said first orifice (27) free. In other words, this first membrane (29) completely or partially covers said first surface (22) but does not close off said first orifice (27) and does not extend beyond the edges of the latter.

The first membrane (29) is not essential, it is not strictly speaking a membrane but a mask which makes etching the substrate, to form the void or cavity (24), easier.

The cavity (24) may, in the mould according to the invention, be defined as a void, in the case where the first orifice (27) is left free (as shown in the figures), or is only partially closed off. But this configuration of the cavity (24), in the form of a void, is not however essential, which is to say that the cavity (24) may be closed at either end, this being the case when the membrane (29) completely covers and closes off the first orifice (27).

A cavity configuration in the form of a void is useful when there are alignment marks for positioning the structure.

In this case, it would be possible to see through the void when positioning the structure.

If there is no alignment, the void is irrelevant.

In this case, a closed cavity (24) is preferred, and not a through-void.

The second orifice (28) is closed off by a second membrane (30) (in the figures, shown as a top membrane) which is resting by one of its sides (31), namely the underside in the case shown in FIG. 2B, on said second principal surface (23) of the substrate (21).

This second membrane (30) completely or partially covers the said second surface (23).

The second membrane (30) may be defined as a support on which the layer (36) containing the heating means (34) is placed, which layer is surmounted by the patterns (37). This membrane (30) is electrically and thermally insulating because the heating elements (34), which, in general, must be quite near the patterns (37), are embedded in this membrane.

By "quite near", it is understood, in general, that the heating elements (34) are located, in general, at a distance of a few nanometers (for example 2, 3, 5, 10, 20 nm) up to 100 nm or a few hundreds of nanometers (for example 200, 300, 500, 1000, 2000 nm) from the patterns (37).

Said first and second membranes (29, 30) generally have a thickness of 100 nm to 200 nm.

These first (29) and second (30) membranes are generally made of a material chosen from materials resistant to the etching of the substrate, in particular from materials resistant to the anisotropic etching of the silicon substrate, such as $Si_3N_4$.

It should be noted that the membrane (30) is not necessarily used as an etch stop but, advantageously, it may be used for this purpose.

The free part (32) of the underside (31) of said second membrane (30), on the side of the second orifice (28), and therefore not resting on the second principal surface (23) of the substrate (21), optionally comprises a thermally conducting layer (33).

This layer (33) is generally made of a material chosen from Si, metals or semiconductors, for example the layer (33) may be made of Si or of TiN. The layer (33) is generally, from 500 nm to 5 μm thick.

The layer (33) is not essential. The layer (33) is thermally conducting and not thermally insulating so as to obtain a temperature uniform over the entire surface beneath the heating means (34). But it may be desirable to add an insulating layer (not shown) beneath this layer (33) in order to inhibit convection and to limit the diffusion of heat into the substrate (21).

This first layer (33) covers generally only a fraction of the free part (32) of the underside (31) of the second membrane (30)—it is generally placed at the centre of said free part, and is aligned, is corresponding, with the centre of said second orifice (28).

Heating means (34) are deposited on the other of the sides (35) of said membrane (30) in a zone of said second membrane above said second orifice (28) of the cavity (24) and above said optional first layer (33). These heating means or heating elements (34) are generally consisting in an electrically resistive heating layer (heating resistance layer) covering, at least partially, said zone. This electrically resistive heating layer (34) is generally 10 nm to 500 nm thick.

This electrically resistive heating layer generally has defined, determined, patterns, shape, geometry in the plane of the layer.

The exact position of the heating elements (34), their shape, their geometry and their dimensions may be easily specified by a person skilled in the art optionally by simulation experiments. The dimensions of the heating elements (34) depend, in particular, on the thermal properties of the mould, the thermal properties of the material to be imprinted, such as a resin, as well as on the maximum temperature to be reached and on the density of the imprint patterns.

The shape and geometry of the heating elements (34) determine the temperature distribution, the necessary power and the impedance of the heating circuit.

The heating elements (34) may be made from any conductor, but platinum, titanium nitride, single-crystal or polycrystalline silicon, preferably doped single crystal or polycrystalline silicon, and more preferably highly doped single crystal or polycrystalline silicon, are preferred for their electrical properties and their compatibility with microfabrication and nanofabrication technologies.

It is possible to obtain a uniform temperature over the entire mould surface zone located above the heating elements, namely the central region that contains the imprint patterns, by optimizing the geometry of the heating element. The geometry of the heating element shown in FIG. 2A is an example of such an optimized geometry.

A uniform temperature is also obtained right through the thickness of the membrane (30).

The temperature of the heating elements (34) may be controlled either by an integrated sensor, generally produced in the same material as the heating elements, or by precisely controlling the power delivered to these heating elements.

An electrically and thermally insulating layer (36) covers said heating means (34) and said second membrane (30). In other words, the electrically and thermally insulating layer (36) covers said heating means (34) in those parts of the surface (35) of the second membrane on which the heating elements (34) are provided or even the surface of the second membrane (30) in those parts of the surface (35) of the second membrane (30) on which heating elements (34) are not provided.

This electrically and thermally insulating layer (36) is generally made of a material chosen from $SiO_2$, $Si_3N_4$, $Al_2O_3$, and $HfO_2$. This electrically and thermally insulating layer (36) is generally 10 nm to 500 nm thick.

The layer (36) is thermally insulating but the patterns (37) are heated all the same.

This is because the layer (36) is generally sufficiently thin (10 nm to 500 nm) to allow vertical thermal diffusion (heat transfer) to the patterns, but this thickness does not allow lateral, thermal diffusion (heat transfer). Most of the heat is therefore used to heat the patterns (37) and not the substrate (21).

The mould according to the invention comprises imprint patterns (patterns to be printed) (37) on said electrically and thermally insulating layer (36) in a zone of said layer above said optional first layer (33) and consequently above said second orifice (28) of said cavity (24).

These patterns (37) of the mould consist of a structure, structuration, for example a nanostructure, nanostructuration, that corresponds to the structure, structuration, of the material, such as an organic resin or an inorganic material, to be imprinted.

The structure, structuration, for example the nanostructure, nanostructuration, of the mould may consist of a periodic array. This periodic array may be a one-dimensional or a two-dimensional array.

Such a one-dimensional array may for example be an array of lines with periodic patterns of period P and height h. The period P may be from 10 nm to one or a few microns, preferably from 100 nm to 1 µm, and even more preferably from 200 nm to 600 nm, and the height h may be from at least 5 nm to 500 nm, preferably from 50 nm to 200 nm.

If the array is a two-dimensional array, it may be chosen, in particular, from square arrays, triangular, rectangular and hexagonal arrays or more complicated arrays such as an array in an Archimedean pattern or tessellation.

The array may also be an array of pads.

It should be noted that the structure, structuration, generally consists of simple, non-rounded, geometric patterns. For example, the lines may be of triangular, rectangular or square cross section.

It should be noted that the heating means or heating elements (34) are generally quite near the patterns (37), that is to say the distance between these heating means (34) and these patterns is generally in the range given above, which may extend from a few nanometers up to 100 or several hundred nanometers in the thickness direction.

The mould according to the invention furthermore comprises means for supplying an electric current to said heating means (34).

Advantageously, these means may consist of one or more current leads (38) that penetrate through the thicknesses of the optional first membrane (29) (bottom membrane), of the substrate (21) and of the second membrane (30) (top membrane) and that are electrically connected to the heating elements (34).

Figure 3A:
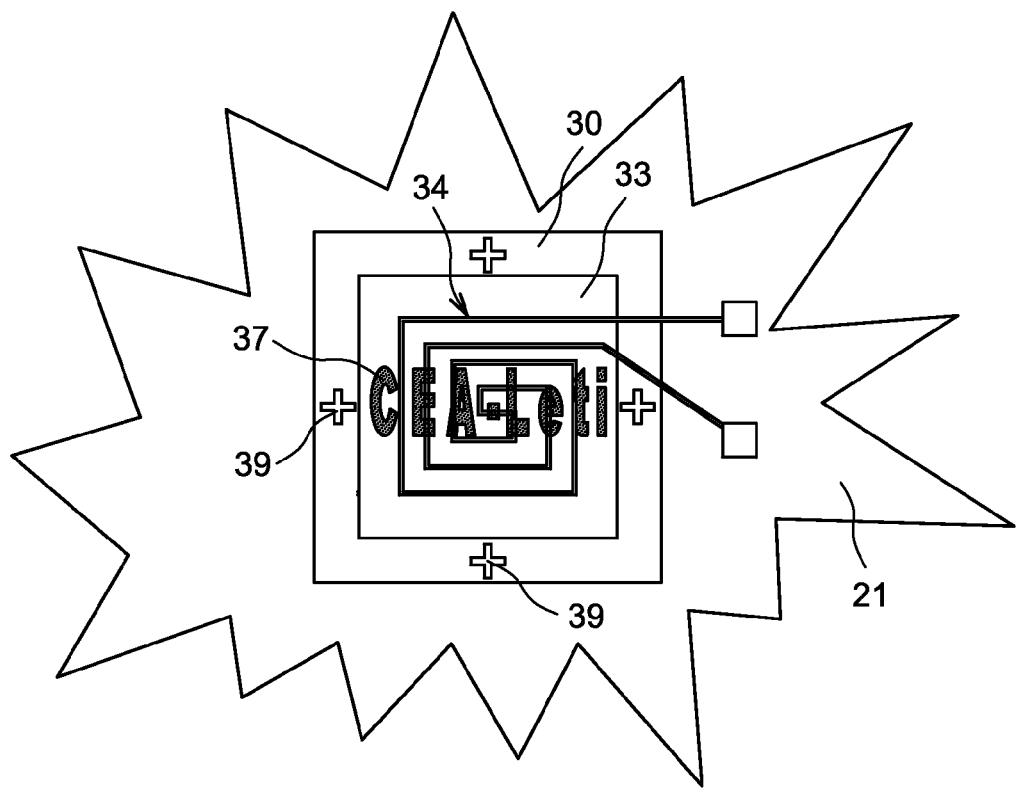
FIG. 3A shows a schematic top view of a heating mould according to the invention comprising patterns and alignment marks positioned near the imprint patterns.
Figure 3B:
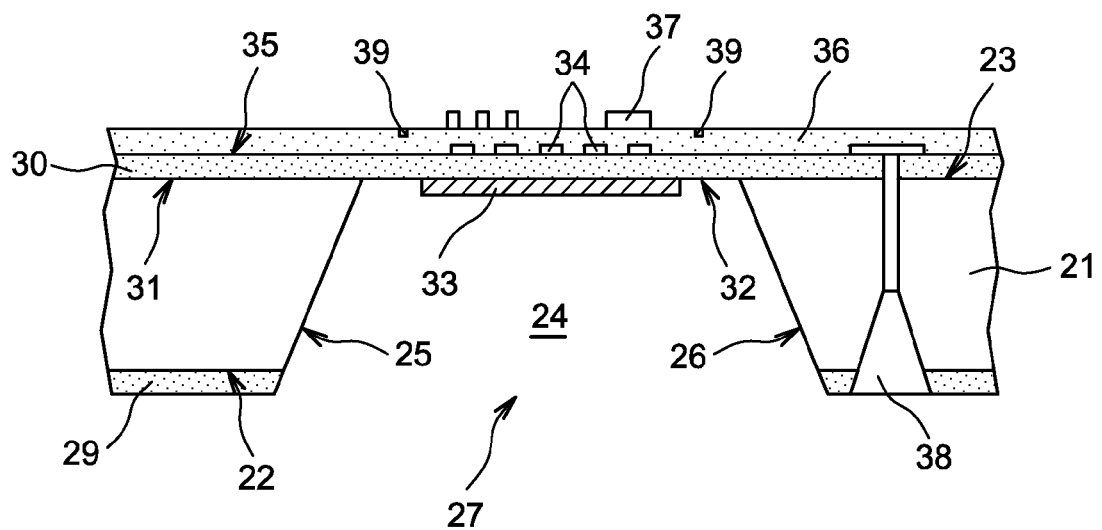
FIG. 3B is a schematic view, in vertical cross section, of a heating mould according to the invention comprising patterns and alignment marks positioned near the imprint patterns.

Advantageously, as shown in FIGS. 3A and 3B, the mould according to the invention may include alignment or positioning marks or structures (39).

These marks or structures (39) may have the shape of a square or a cross or may even take the form of alignment verniers like those used in optical lithography for example.

In fact, the shape chosen will depend on the software and on the image recognition that will be employed later on—the shape therefore will depend on the characteristics of the equipment used.

As for the material of these positioning marks, and because it is not essential that these marks be heated, advantageously materials compatible with microfabrication and nanofabrication processes will be used.

FIGS. 3A and 3B show alignment marks or structures provided in the electrically and thermally insulating layer (36) near the imprint patterns (37).

As shown in FIGS. 3A and 3B, these marks may, in general, be located outside the region of the insulating layer (36) on which the imprint patterns are situated.

As shown in FIGS. 3A and 3B, these marks may, in general, be furthermore located above the second orifice (28) but not above the optional layer (33).

The marks are, rather, generally situated above that segment, part, of the free part (32) of the underside (31) of the second membrane (30) which is not covered by the optional layer (33).

Figure 3C:
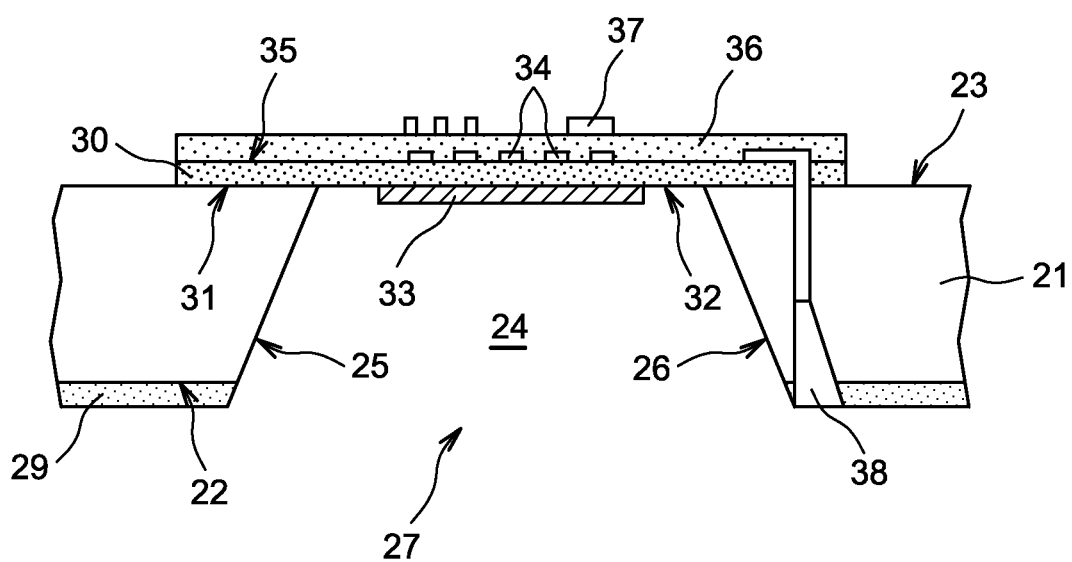
FIG. 3C is a schematic view, in vertical cross section, of a heating mould according to the invention with a structure comprising "mesas", the second membrane (30), the electrically and thermally insulating layer (36) and also possibly and preferably the substrate having been etched so that a non-useful surface is recessed.

FIG. 3C shows an embodiment of the heating mould according to the invention in which, beyond the outside functional zone, the layers (30), (36) and also possibly and preferably, the substrate (21) have been etched so as to recess the non-useful surface of the substrate. It may also be said that "mesas" are produced.

Such an operation reduces the contact area of the front side of the mould with the resin, this reduces defects and makes the mould release easier. This configuration, shown in FIG. 3C, may also make the attachment of the mould onto the machine support easier.

More precisely, the "functional zone" is the zone of these layers and of the substrate that comprises and/or supports the heating means or heating elements (34), the imprint patterns (37), the means (38) for supplying an electric current to the heating means (34) and the optional positioning or alignment marks (39, 40).

The layers (36) and (30) are etched right through their thicknesses and the substrate may be etched to a depth of a few tens of nanometers (for example 20, 30, or 50 nm) up to a few hundred nanometers (for example 200, 300, 400 and 500 nm) (FIG. 3C).

The various steps of a process for fabricating a mould according to the invention are shown in FIGS. 4A to 4H.

Figure 4A:
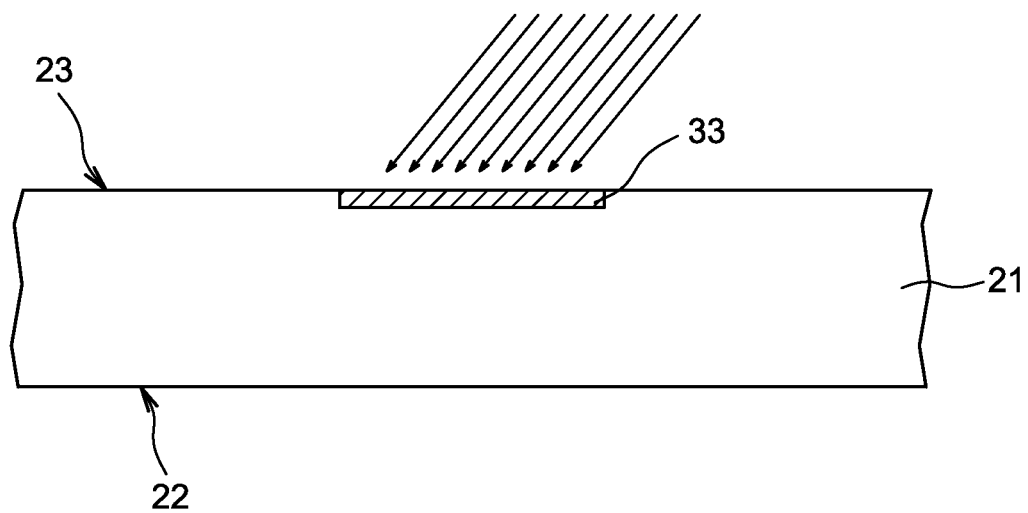
FIGS. 4A to 4H are schematic views, in vertical cross section, showing, in succession, the steps for fabricating a mould according to the invention.

In a first step, shown in FIG. 4A, the thermally conducting layer (33), which will mechanically support the membrane (30), and which will also allow a uniform temperature to be obtained in the imprint region, is produced on a substrate (21) in a defined zone of the second surface (which may be a top surface) of the latter (23).

This layer (33) may be produced by selectively doping the substrate material, such as silicon, by implanting ions, in particular $N^+$ ions, followed by annealing, or even by diffusion. Thus, for example, a SiN layer (33) is obtained.

Highly doped layers have the property not to be etched upon anisotropic etching of Si.

Figure 4B:
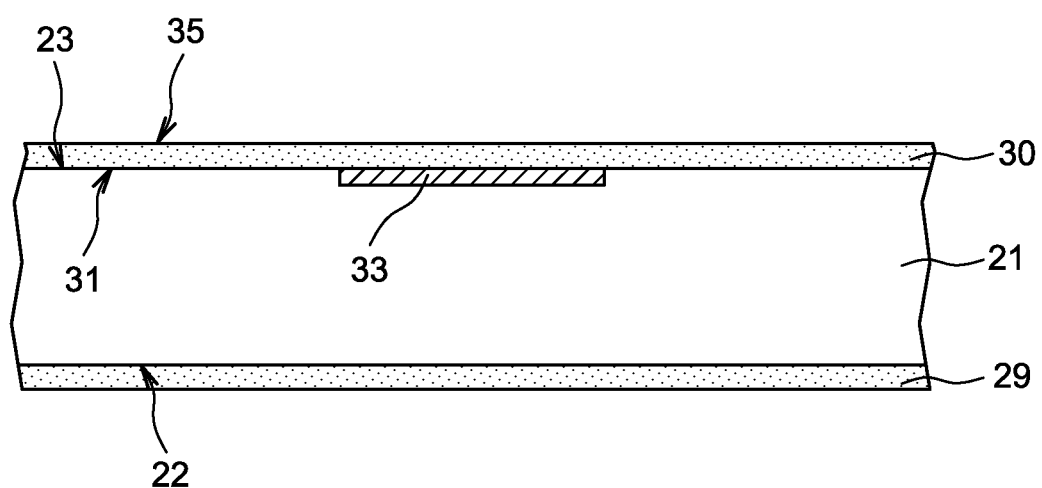

In a second step, shown in FIG. 4B, a membrane layer (29, 30), made of a material (such as $Si_3N_4$) resistant to the anisotropic etching of the substrate material, is deposited over the entire surface of the two sides (22, 23) of the substrate (21).

Figure 4C:
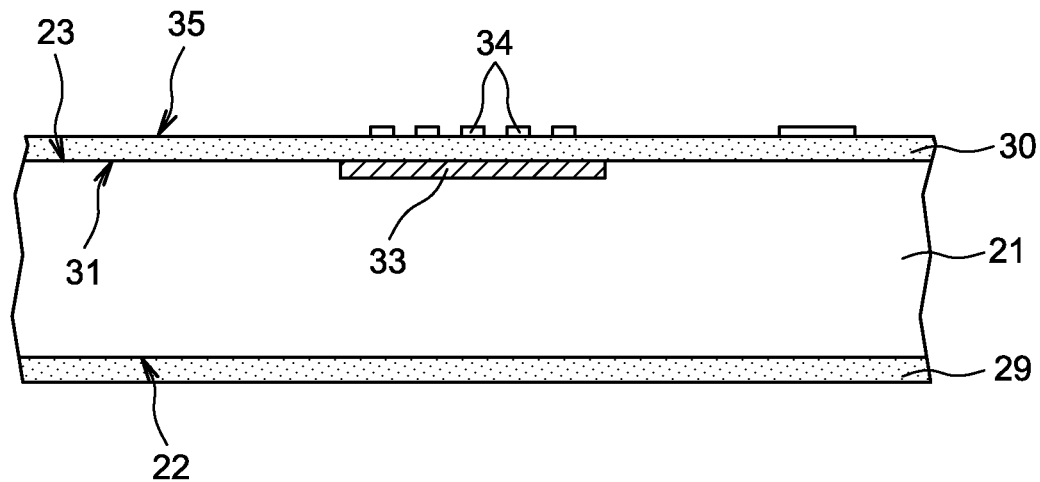

In a third step, shown in FIG. 4C, an electrically resistive heating layer (heating resistance layer) (34), for example made of a metal such as platinum, of titanium nitride or of polysilicon, is deposited over the entire top surface (35) of the second (top) membrane. Next, the resistive layer (resistance) is patterned, shaped, by photolithography and dry- or wet-etching. This patterning gives the resistance the desired geometry, optionally optimized, such as that shown (34) in FIGS. 2B and 3B.

Figure 4D:
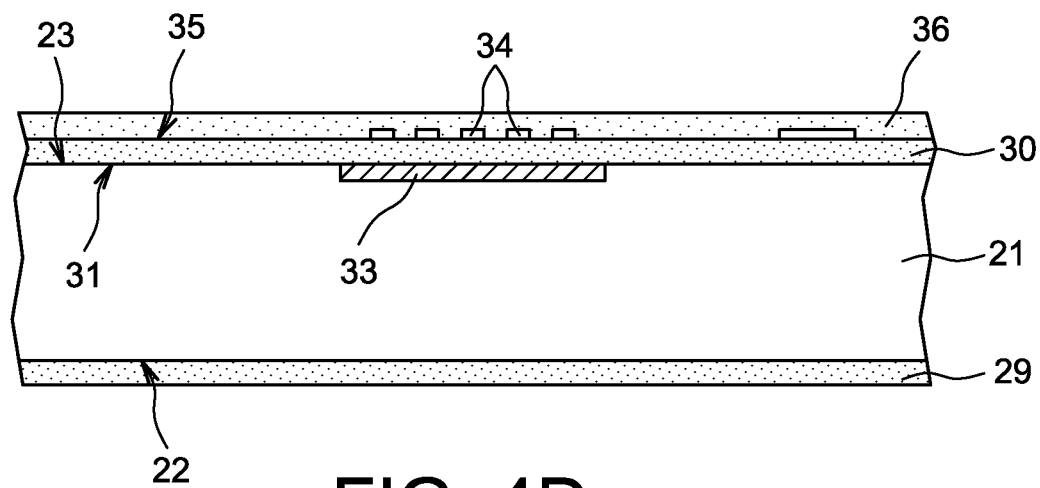

In a fourth step, shown in FIG. 4D, a thermally and electrically insulating layer (36), for example made of a material such as $SiO_2$, $Si_3N_4$, $Al_2O_3$ or $HfO_2$, is deposited on the heating elements (34) and onto the second membrane layer (30). This insulating layer (36) may optionally consist of several layers, each of these layers optionally being made of a different material.

After the deposition of the insulating layer (36), the deposited layer is generally planarized by chemical-mechanical polishing (CMP).

Figure 4E:
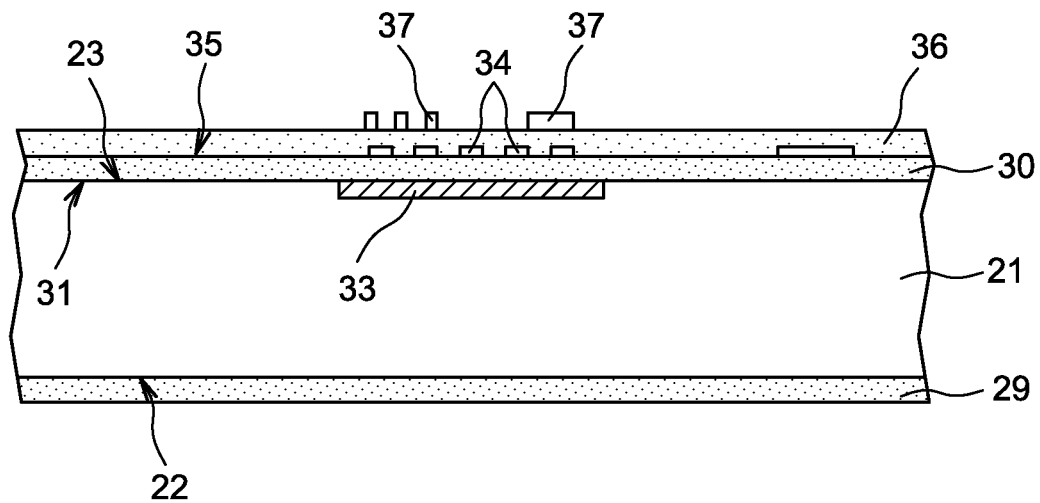

In a fifth step, shown in FIG. 4E, imprint patterns (37) (structures, structurations, or nanostructures, nanostructurations) are produced on the insulating layer (36).

Advantageously, these patterns (37) are fabricated by giving a structure to a thin film (structuring a thin film), for example made of Si, $SiO_2$, $Si_3N_4$, $Al_2O_3$, $HfO_2$ or of a multilayer, generally by photolithography and selective etching.

Figure 4F:
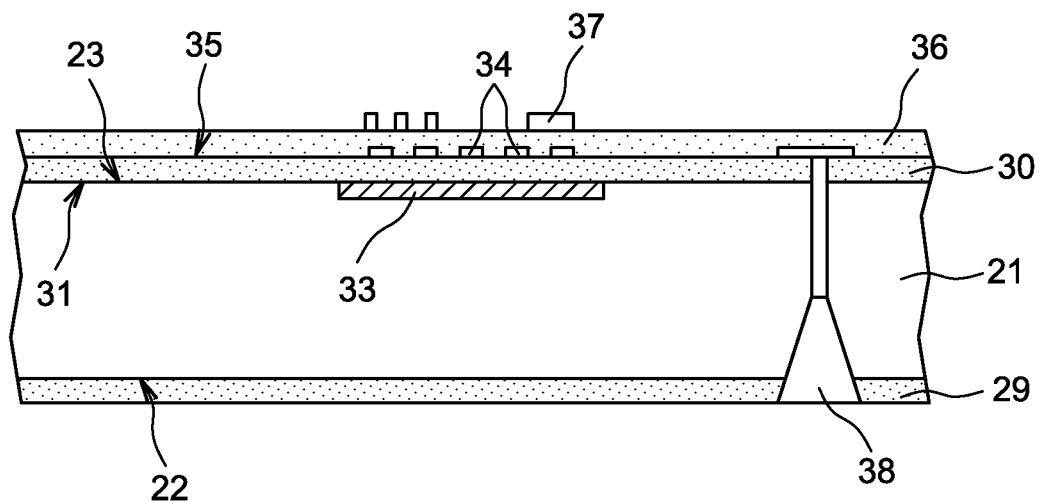

In a sixth step, shown in FIG. 4F, the leads that supply the heating elements with current are fabricated.

To do this, advantageously the substrate is etched with a deep etch, for example using deep RIE (RIE standing for reactive ion etching), so as to create a via penetrating, in the thickness direction, the two membranes and the substrate.

This via is then filled with a conductor (conductive material), such as copper, by electrodeposition.

Figure 4G:
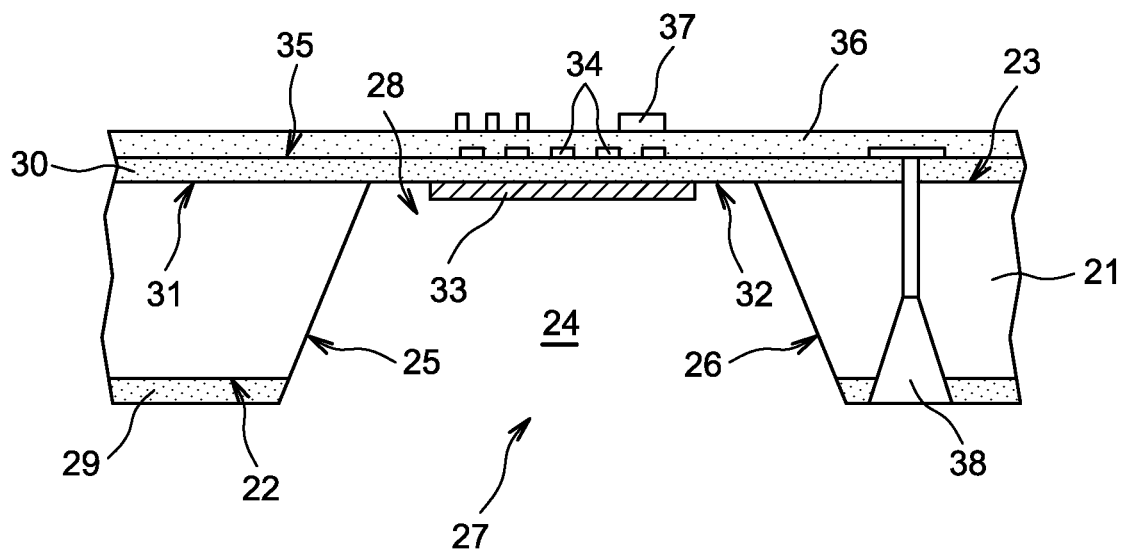

In a seventh step, shown in FIG. 4G, the bottom membrane or protection layer, for example made of $Si_3N_4$, is generally, first of all, patterned by lithography and dry etching. Next, the top membrane (30) is freed by anisotropic etching, for example with potassium hydroxide (KOH) or tetramethylammonium hydroxide (TMAH or TMAOH), of the material of the substrate (21) from the bottom surface or back side (22) of this substrate.

The process may optionally include an eighth step, if it is desired to fabricate a substrate such as that shown in FIGS. 3A and 3B, during which positioning or alignment marks (39) are produced, for example in the insulating layer (36) near the imprint patterns (37).

In general, the marks may be produced at the end of the process, or at the same time as the layers (30), (34) and the patterns (37) are produced. They may be made in the layer (30) or in the layer (36) and even at the same level as the patterns (37) (provided that the size of these marks (39) is smaller than the size of the patterns (37)): it is this embodiment which is shown in FIG. 3B.

The marks may optionally be in relief or recessed, in other words, the marks may be bumps or holes.

Figure 4H:
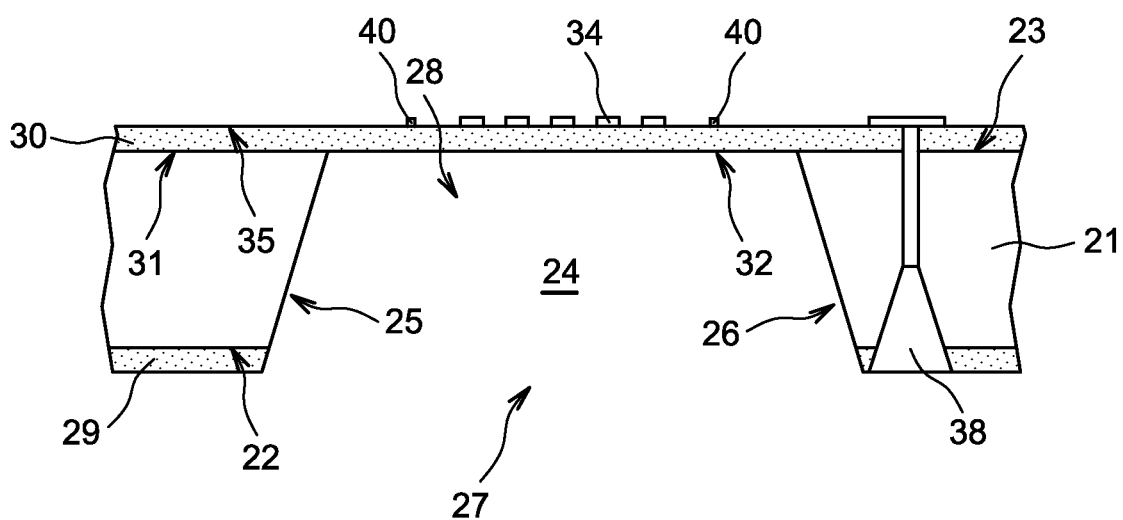

The FIG. 4H is a variant of the third step shown in FIG. 4C, in which a series of positioning or alignment marks (40) are produced on the top membrane (30) near the patterned, shaped, heating elements (34). These marks (39, 40) may then be used to align the structures with the preceding levels.

The fabrication process then follows the same steps as those previously described (FIGS. 4D to 4G).

In general, these marks (39, 40) may be produced during the patterning, shaping, of the electrically resistive heating layer by further patterning the same conducting layer (34), but they may also be placed on top of the surface of the mould, generally on the layer (36), by depositing an opaque layer, such as for example a layer of silicon, which is then patterned in a lithography and selective etch step to give the marks (39).

The mould according to the invention may be used in a process for fabricating a substrate comprising a surface nanostructured by thermal nanoimprint lithography.

Such a process may for example comprise, in succession, the following steps:

a) a layer of organic resin or a low melting-point inorganic material is deposited on a flat surface of a substrate;

b) the organic resin is heated up to a temperature higher than or equal to its glass transition temperature $T_g$ or its melting point, or the inorganic material is heated up to a temperature higher than or equal to its melting point, and the layer of organic resin or liquid inorganic material is imprinted with the mould according to the invention having a nanostructuration, whereby the layer of organic resin or of inorganic material is provided with a first nanostructure, nanostructuration, corresponding to the nanostructure, nanostructuration, of the mould;

c) the temperature of the organic resin or the inorganic material is lowered down to a temperature at which it is solid; and d) the mould is separated from the solidified layer of organic resin or inorganic material integral with the substrate.

The invention will now be described with reference to the following illustrative and non-limiting example.

EXAMPLE

In this example, the production of a mould according to the invention by a process according to the invention, as illustrated in FIGS. 4A to 4H, is described.

1) Initially, as shown in FIG. 4A, a resin mask was produced with conventional microelectronic processes (typical of the implantation level). The resin was at least 500 nm thick, making it possible to bare certain zone(s) of the substrate, this(these) being subsequently implanted. This zone provides localized uniform heating of what is called the "active" zone.

The zone beneath the membrane was selectively doped $n^{++}$, for example by implanting P ions at approximately 200 keV and at $10^{15}$ $A/cm^2$, and RTP heat treatment at 1100° C. for approximately 30 seconds.

2) Next, as shown in FIG. 4B, a membrane layer resistant to the anisotropic etching of Si (typically $Si_3N_4$) was deposited. Here, wafer(plate)-scale deposition on both sides of the substrate to a thickness of 100 nm-200 nm was implemented.

3) Next, as shown in FIG. 4C, wafer(plate)-scale deposition of an electrically resistive heating layer, advantageously Pt (50 nm) or TiN (150 nm), was performed followed by the patterning of the resistance by an e-beam photolithography process (with 150 nm of resin), for example so as to attain sub 100 nm dimensions, and by dry ion etching (IBE/RIE). The form, shape, of the heating patterns was thus defined.

4) Next, as shown in FIG. 4D, an insulating layer, typically $SiO_2$, was deposited. The thickness of this layer was greater than the thickness of the etched conducting layer, typically 2 to 3 times the step height. The deposition was followed by a CMP planarization step to obtain a planar layer.

5) Next, as shown in FIG. 4E, imprint patterns were produced. Advantageously, the patterns were fabricated by patterning a thin silicon film, 100 nm in thickness, by electron beam lithography, so as to attain a sub 100 nm resolution, and by selective etching.

6) As shown in FIG. 4F, an optical lithography process was carried out on the back side of the substrate, in order for the layer deposited during step 2) to be locally etched, and then the whole of the thickness of the Si substrate was etched by deep etching processes. The etching was stopped at the end of the conducting layer patterned, shaped, during step 3). Next, the hole thus obtained was filled with electroplated copper to obtain an electrical connection between the back side and the heating circuit.

7) Finally, as shown in FIG. 4G, the membrane was freed by etching the protection layer produced during step 2) and then by anisotropically etching the back side Si with KOH or TMAH. This etch step generally lasted several hours depending on the temperature and the concentration of the bath. The etch was stopped on the layer deposited during step 2). The back side protection layer (typically made of $Si_3N_4$) was patterned, structured, by lithography and dry etching.

The invention claimed is:

1. A heating mould for thermal nanoimprint lithography comprising:
   a substrate having a first principal surface and a second principal surface, and a through-cavity extending from a first orifice in the first principal surface up to a second orifice in the second principal surface, said second orifice being completely closed off by a first membrane, which is an electrically and thermally insulating membrane, with a first side disposed in contact with said second principal surface and at least partially covering said second principal surface;
   heating means disposed on a second side of said first membrane in a zone of said first membrane above said second orifice;
   an electrically and thermally insulating layer which covers said heating means and, at least partially, said first membrane;
   imprint patterns disposed on said electrically and thermally insulating layer in a zone of said electrically and thermally insulating layer above said second orifice; and
   means for supplying an electric current to said heating means.

2. The mould according to claim 1, in which said first and second principal surfaces are planar and parallel.

3. The mould according to claim 2, in which said first and second principal surfaces are horizontal.

4. The mould according to claim 1, further comprising alignment marks.

5. The mould according to claim 4, in which said alignment marks are located in the first membrane, in said electrically and thermally insulating layer, or on said electrically and thermally insulating layer near the imprint patterns, or a combination thereof.

6. The mould according to claim 1, in which the substrate is made of a material chosen from among a group of materials compatible with microfabrication and nanofabrication.

7. The mould according to claim 1, in which the first membrane is made of a material resistant to anisotropic etching of the substrate material.

8. The mould according to claim 1, in which the heating means are made of a material chosen from among platinum, titanium nitride, single-crystal silicon, polycrystalline silicon and all conductive materials compatible with microfabrication and nanofabrication technologies.

9. The mould according to claim 1, in which the electrically and thermally insulating layer is made of a material chosen from $SiO_2$, $Si_3N_4$, $Al_2O_3$, $HfO_2$, and all the electrically and thermally insulating materials compatible with microfabrication and nanofabrication technologies.

10. The mould according to claim 1, in which the imprint patterns are made of a material chosen from Si, $SiO_2$, $Si_3N_4$, $Al_2O_3$, $HfO_2$, and all the materials compatible with microfabrication and nanofabrication technologies.

11. A process for producing a mould according claim 1, the process comprising the following steps performed in succession:
   providing a substrate having a first principal surface and a second principal surface;
   depositing a first electrically and thermally insulating membrane on said second principal surface of the substrate;
   depositing an electrically resistive heating layer on a zone of the first electrically and thermally insulating membrane;
   shaping the electrically resistive heating layer;
   depositing an electrically and thermally insulating layer on said shaped electrically resistive heating layer and onto the first electrically and thermally insulating membrane;
   producing imprint patterns on said electrically and thermally insulating layer; and
   forming at least one lead for supplying electric current to the electrically resistive heating layer,
   wherein the mould comprises
      the substrate having the first principal surface and the second principal surface, and a through-cavity extending from a first orifice in the first principal surface up to a second orifice in the second principal surface, said second orifice being completely closed off by said first electrically and thermally insulating membrane with a first side disposed in contact with said second principal surface and at least partially covering said second principal surface;
      heating means disposed on a second side of said first electrically and thermally insulating membrane in a zone of said first electrically and thermally insulating membrane above said second orifice;
      said electrically and thermally insulating layer which covers said heating means and, at least partially, said first electrically and thermally insulating membrane;
      said imprint patterns disposed on said electrically and thermally insulating layer in a zone of said electrically and thermally insulating layer above said second orifice; and
      said at least one lead for supplying electric current to said heating means.

12. The process according to claim 11, in which the at least one electric current lead is fabricated by etching at least one via through the first electrically and thermally insulating membrane, through the substrate, or a combination thereof, and by filling said at least one via by electrodeposition.

13. A process, comprising:
   producing a substrate comprising a nanostructured surface by thermal nanoimprint lithography using a mould,
   wherein the mould comprises
      a substrate having a first principal surface and a second principal surface, and a through-cavity extending from a first orifice in the first principal surface up to a second orifice in the second principal surface, said second orifice being completely closed off by a first electrically and thermally insulating membrane with a first side disposed in contact with said second principal surface and at least partially covering said second principal surface;
      heating means disposed on a second side of said first membrane in a zone of said first membrane above said second orifice;
      an electrically and thermally insulating layer which covers said heating means and, at least partially, said first membrane;
      imprint patterns disposed on said electrically and thermally insulating layer in a zone of said electrically and thermally insulating layer above said second orifice; and
      means for supplying an electric current to said heating means.

14. The process according to claim 11, further comprising:
forming alignment or positioning marks in a layer of the first electrically and thermally insulating membrane, in the insulating layer, or on said electrically and thermally insulating layer near the imprint patterns, or a combination thereof.

15. The mould according to claim 7, wherein the substrate is made of silicon and the first membrane is made from $Si_3N_4$.

16. The mould according to claim 1, wherein said first principal surface is at least partially covered by a second membrane and said second membrane completely closes off said first orifice.

17. The mould according to claim 1, wherein said first principal surface is at least partially covered by a second membrane and said second membrane partially closes off said first orifice.

18. The mould according to claim 1, wherein said first principal surface is at least partially covered by a second membrane and said second membrane is disposed so as to not cover any portion of said first orifice.

19. The mould according to claim 1, further comprising:
a thermally conducting layer that mechanically supports the first membrane on said first side of the first membrane above said second orifice.

20. The mould according to claim 19, further comprising:
an insulating layer disposed beneath said thermally conducting mechanical support layer.

21. The process according to claim 11, further comprising:
before said step of depositing a first electrically and thermally insulating membrane, forming a thermally conducting and mechanical support layer in a zone of the second principal surface of the substrate.

22. The process according to claim 11, further comprising:
before said step of depositing a first electrically and thermally insulating membrane,
depositing a second membrane on said first principal surface of the substrate.

23. The process according to claim 22, further comprising:
after said step of forming at least one lead for supplying electric current to the electrically resistive heating layer, etching the second membrane, then forming a cavity in the substrate from a first orifice in the first principal surface up to the thermally conducting and mechanical support layer, in a zone of the second principal surface.

24. The process according to claim 23, wherein said first principal surface is at least partially covered by said first membrane and said second membrane completely closes off said first orifice.

25. The process according to claim 23, wherein said first principal surface is at least partially covered by said second membrane and said second membrane partially closes off said first orifice.

26. The process according to claim 23, wherein said first principal surface is at least partially covered by said second membrane and said second membrane is disposed so as to not cover any portion of said first orifice.

27. The process according to claim 13, wherein said first principal surface is at least partially covered by a second membrane and said second membrane completely closes off said first orifice.

28. The process according to claim 13, wherein said first principal surface is at least partially covered by second membrane and said second membrane partially closes off said first orifice.

29. The process according to claim 13, wherein said first principal surface is at least partially covered by a second membrane and said second membrane is disposed so as to not cover any portion of said first orifice.

30. The mould according to claim 1, wherein the material of the substrate is made of a material chosen from among silicon, silicon oxide, silicon nitride, germanium, sapphire, GaAs, and composite materials comprising several of these materials.

31. The mould according to claim 16, in which the second membrane is made of a material resistant to anisotropic etching of the substrate material.

32. The mould according to claim 17, in which the second membrane is made of a material resistant to anisotropic etching of the substrate material.

33. The mould according to claim 18, in which the second membrane is made of a material resistant to anisotropic etching of the substrate material.

34. The mould according to claim 16, wherein the second membrane is made from $Si_3N_4$.

35. The mould according to claim 17, wherein the second membrane is made from $Si_3N_4$.

36. The mould according to claim 18, wherein the second membrane is made from $Si_3N_4$.

37. The process according to claim 21, wherein the electrically resistive heating layer is deposited above the thermally conducting and mechanical support layer.

* * * * *